March 5, 1963 H. L. SHORTT 3,079,674

CONTACT CONNECTION FOR PRINTED CIRCUIT PRODUCTS

Original Filed Oct. 20, 1954

INVENTOR.
HUBERT L. SHORTT
BY Frederick L. Haug
ATTORNEY 3,079,674

CONTACT CONNECTION FOR PRINTED CIRCUIT PRODUCTS

Hubert L. Shortt, Tarrytown, N.Y., assignor to Technograph Printed Electronics Inc., Tarrytown, N.Y.

Original application Oct. 20, 1954, Ser. No. 463,475. Divided and this application Nov. 26, 1958, Ser. No. 781,180
7 Claims. (Cl. 29—155.5)

The present invention relates to printed circuit products, and more particularly to contact connections for printed circuit products and to a method of making such contact connections.

Printed circuit products generally comprise a conductive pattern representing a circuit system or a circuit component supported on an insulation backing adhering thereto. For the purpose of the invention, the conductive pattern may be produced by any of the techniques known in this field, for instance by the etched foil method. All the printed circuit techniques, as now known, have in common that the conductive pattern is very thin, generally in the order of foil thickness, as the use of such a thin conductive pattern is an inherent characteristic of printed circuit products. The thickness of the insulation backing may and does vary within wide limits. In actual practice, it may vary between paper thin insulation sheets and solid blocks of insulation material.

Irrespectively of the thickness of the insulation backing, the problem often arises to make high quality contact connections with the conductive pattern through the insulation backing. The quality of the contact connections is of particular importance for printed circuit products as such products are frequently used in electronic equipment which demands low contact resistance and high constancy of the characteristics of the connections coupled with adequate mechanical strength.

Accordingly, one of the objects of the present invention is to provide a novel and improved high quality contact connection for printed circuit products.

Another object of the invention is to provide a novel and improved contact connection which combines high quality contact characteristics with high quality mechanical properties.

Still another object of the invention is to provide a novel and improved contact connection in which the contact material constituting the conductive pattern and the material constituting the contact connection proper form a substantially homogeneous body thereby assuring an electrically practically perfect connection and a strong mechanical bond between the conductive pattern and the contact connection.

A further object of the invention is to provide a novel and improved contact connection which is substantially flush with the outer surface of the conductive pattern proper. This affords the advantage that the printed circuit product may suitably coact with a sliding contact as is required for instance, in the telephone art in connection with selector switches or relays, or may constitute a component of a capacitative coupling.

A still further object of the invention is to provide a novel method of producing the afore referred to contact connections which method permits to produce the contact connections in an inexpensive, simple and uniform manner.

Other and further objects, features and advantages will be pointed out hereinafter and set forth in the appended claims forming part of the application.

In the accompanying drawing a preferred embodiment of the invention is shown by way of illustration and not by way of limitation in conjunction with which the method according to the invention will be further explained.

Referring now to the figures in detail, the figures show a metallic conductor 1 which may be visualized as one of the pathways of a conductive pattern produced by any printed circuit technique. Conductor 1 is secured to an insulation base 2 by any means suitable and known for the purpose, for instance, by an adhesive layer 3. In this connection it should be mentioned that at least the thickness of the conductor 1 is greatly exaggerated. In actual practice, this conductor is usually in the order of foil thickness.

Figures 1, 2, 3, 4, 5, 6:
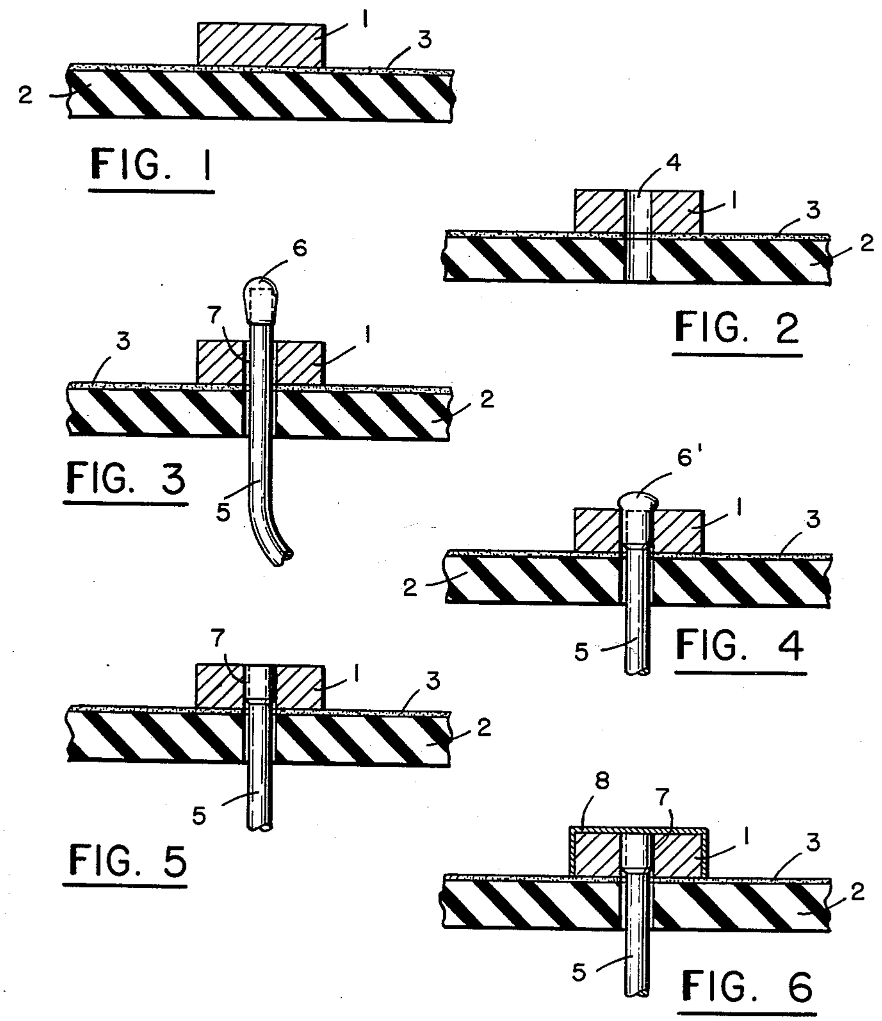
FIG. 1 is a fragmentary sectional view of a printed circuit product with which a conductor is to be connected.
FIG. 2 is a sectional view similar to FIG. 1 showing the first step of preparing a junction point between the circuit product and a conductor.
FIGS. 3, 4 and 5 show successive stages of making the contact connection.
FIG. 6 is a sectional view of the completed contact connection.

Let it now be assumed that a contact connection according to the invention is to be made between a wire and conductor 1 through insulation backing 2 and adhesive layer 3. To prepare the junction point of the conductor for this purpose, a hole 4 is drilled or otherwise made through the entire structure. FIG. 2 shows this step of the operation. The diameter of this hole should be slightly larger than the diameter of the wire to be connected to conductor 1.

A wire 5 to be connected is now inserted through the hole, with the end of the wire slightly protruding from the upper plane of conductor 1. The protruding end of the wire is slightly enlarged or headed by a tip or cap 6 of soft solder or an equivalent conductive matereial as is shown in FIG. 3. Tip 6 may be applied to wire 5 either before or after insertion of the wire in the hole. This figure also shows that there is a narrow annular clearance 7 between conductor 1 and wire 5.

The next step is to retract wire 5 back into the conductor hole so that the soft solder material is forced into space 7 and fills the said space as completely as practical. FIG. 4 shows wire 5 retracted into a position in which its end is substantially flush with the outer surface of conductor 1, the surplus solder material 6′ forming a protruding blob.

Thereupon the surplus solder material is removed by a suitable machining operation such as planing or shaving to level the surface of conductor 1 and wire 5.

As is apparent from the previous description, wire 5 is now connected with conductor 1 by the strong electrical and mechanical bond formed by solder material wedged into annular space 7. The bond between wire 5 and conductor 1 may be further strengthened, if desirable, by applying sufficient heat to melt the soft solder to form a hot solder joint.

The contact connection can be further improved by coating the entire conductor 1 or at least the vicinity of the junction point with a metal layer 8. This layer may be made of the same metal as used for conductor 1 but may also be of a metal selected to produce any desired property of the surface of conductor 1 which is either lacking or insufficient in the metal of which the conductor is made. For instance, the metal of the layer may be such as to improve the electrical or thermal conductivity of the conductive pattern, or the wear and abrasion resistance, or the corrosion and arc resistance thereof. Layer 8 may be produced by any means suitable for the purpose such as electro-deposition.

Figure 7:
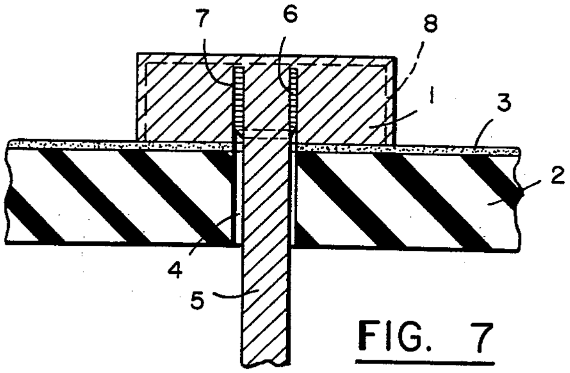
FIG. 7 is an enlarged sectional view of the completed contact connection to illustrate the homogenity of the contact connection.

The result of the aforedescribed operations is an excellent electrical and mechanical connection between conductor 1 and wire 5. Conductor 1, wire 5, layer 8 and the solder material 6 forced into annular space 7 constitute a homogeneous body for all practical purposes. This is symbolized in FIG. 7 by showing layer 8 as part of the conductor proper. This figure also shows the intimate connection between conductor 1 and wire 5 established by the solder material 6 in space 7. The produced contact surface of conductor 1, or more specifically of layer 8 is perfectly smooth and unbroken, the connection proper being invisible. As a result, a conductive pattern connected by a connection according to the invention lends itself to coaction with devices employing wiper contacts, or to use as a component of a capacitative coupling. In either case, the distance between the surface of the conductive pattern and the respective surface of the part coacting therewith must usually be in the order of a few thousandths of an inch which necessitates smooth contact surfaces.

While the invention has been described in detail with respect to a certain now preferred example and embodiment of the invention it will be understood by those skilled in the art after understanding the invention, that various changes and modifications may be made without departing from the spirit and scope of the invention, and it is intended, therefore, to cover all such changes and modifications in the appended claims.

This application is a division of my copending application Serial No. 463,475, filed October 20, 1954, and now abandoned.

What is claimed as new and desired to be secured by Letters Patent, is:

1. A method of connecting a wire conductor to an insulation-backed conductive foil pattern of a printed circuit, said method comprising the steps of providing through the conductive pattern of the printed circuit product a hole having a diameter larger than the diameter of the conductor to be connected, securing to one end of the wire conductor an enlarged tip of soft conductive material, inserting the wire conductor in said hole with the tipped end of the conductor protruding from the outer surface of the conductive pattern and the remainder of the conductor protruding from the insulation backing, said tip having a peripheral outline slightly wider than that of said hole, retracting the conductor portion protruding from the insulation backing so as to deform the soft conductive material by cold flow and to wedge part of the soft conductive material into the clearance between the conductor and the conductive pattern to fill said clearance with the soft conductive material, and removing excess soft conductive material and the conductor part from the outer surface of the conductive pattern to level said surface.

2. A method according to claim 1, wherein the said soft conductive material is a soft solder.

3. A method according to claim 1 and further comprising the step of coating the leveled surface area of the conductive pattern, the conductor and the conductive material with a layer of metal.

4. A method of connecting a wire conductor to the insulation backed conductive foil pattern of a printed circuit product, the said method comprising the steps of providing through the conductive pattern of the printed circuit product of a hole having a diameter slightly larger than the diameter of the conductor to be connected, fitting the conductor in said hole from the insulation side of the printed circuit product and slightly protruding from the pattern side thereof, applying a tip of a soft conductive material having a peripheral outline slightly larger than said hole to the protruding portion of the conductor, said tip being applied spaced apart from the conductive pattern, retracting the conductor into a position in which part of the soft material is deformed by cold flow and wedged into the clearance between the conductor, and the conductive pattern thereby filling the said clearance, and removing protruding soft surplus material from the outer surface of the conductive material thereby leveling the said surface.

5. The method according to claim 4, wherein said soft material is soft solder and comprising the additional step of heating the soft solder to form a hot solder joint.

6. The method according to claim 4 and further comprising the step of coating the surface area surrounding said hole, the conductor fitted in said hole and the soft material filling said clearance with a layer of metal.

7. A method according to claim 6, wherein the said coating step is effected by electro-deposition of metal.

References Cited in the file of this patent

UNITED STATES PATENTS

| | | |
|---|---|---|
| 654,042 | Young | July 17, 1900 |
| 2,007,703 | Bertschi | July 9, 1935 |
| 2,395,348 | Sherman et al. | Feb. 19, 1946 |
| 2,421,047 | Wolfson et al. | May 27, 1947 |
| 2,502,291 | Taylor | Mar. 28, 1950 |
| 2,591,925 | Erbe | Apr. 8, 1952 |
| 2,616,994 | Luhn | Nov. 4, 1952 |
| 2,777,193 | Albright et al. | Jan. 15, 1957 |

FOREIGN PATENTS

| | | |
|---|---|---|
| 1,081,047 | France | June 2, 1954 |